United States Patent
Shen et al.

(10) Patent No.: US 10,658,769 B1
(45) Date of Patent: May 19, 2020

(54) ELECTRONIC DEVICE

(71) Applicant: QISDA CORPORATION, Taoyuan (TW)

(72) Inventors: Chun-Ming Shen, Taipei (TW); Chi-Jen Chen, Taoyuan (TW); Min-Wen Hong, Tainan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/411,150

(22) Filed: May 14, 2019

(30) Foreign Application Priority Data

Dec. 25, 2018 (CN) ........................... 2018 1 1587162

(51) Int. Cl.
*H01R 4/64* (2006.01)
*G03B 21/14* (2006.01)
*H05K 5/02* (2006.01)
*H05K 5/00* (2006.01)

(52) U.S. Cl.
CPC ............. *H01R 4/64* (2013.01); *G03B 21/145* (2013.01); *H05K 5/006* (2013.01); *H05K 5/0247* (2013.01)

(58) Field of Classification Search
CPC ............ H01R 13/65802; H01R 13/648; H01R 13/6594–6596; H01R 4/64; G03B 21/145; H05K 5/0247; H05K 5/006
USPC ..................... 439/97, 95, 76.1, 607.35–607.4
See application file for complete search history.

(56) References Cited

U.S. PATENT DOCUMENTS

| | | | | |
|---|---|---|---|---|
| 4,927,367 A * | 5/1990 | Salvagno | ............. | H05K 9/0039 200/507 |
| 5,563,770 A * | 10/1996 | Bethurum | ............ | G06K 19/077 257/679 |
| 6,053,771 A * | 4/2000 | Hood, III | ................. | H01R 4/64 174/377 |
| 7,094,076 B2 * | 8/2006 | Hatakeyama | ........ | H05K 9/0039 361/753 |
| 7,326,063 B1 * | 2/2008 | Raudenbush | ............ | H01R 4/64 439/581 |
| 9,769,955 B2 * | 9/2017 | Teraki | ........................ | F24F 1/24 |
| 2002/0164895 A1 * | 11/2002 | Hartke | ....................... | G06F 1/18 439/67 |
| 2003/0156400 A1 * | 8/2003 | Dibene, II | ................ | G06F 1/18 361/803 |
| 2006/0223347 A1 * | 10/2006 | Kim | ......................... | H05K 5/02 439/95 |
| 2007/0237348 A1 * | 10/2007 | Phillips | .................. | H04R 1/086 381/355 |
| 2009/0268416 A1 * | 10/2009 | Kanda | .................... | H05K 7/142 361/752 |

(Continued)

*Primary Examiner* — Gary F Paumen

(57) ABSTRACT

An electronic device includes a casing, a circuit board, an electronic component and a fixing member. The casing includes a fixing pillar and at least one rib. The rib is connected to a periphery of the fixing pillar. The circuit board includes a through hole. The fixing pillar is disposed in the through hole. The circuit board abuts against a second top surface of the rib. A thickness of the circuit board is smaller than a height between a first top surface of the fixing pillar and the second top surface of the rib. The electronic component includes a first metal member. A first ground end of the first metal member is disposed on the first top surface of the fixing pillar. A gap exists between the first ground end and the circuit board. The fixing member fixes the first ground end to the fixing pillar.

4 Claims, 4 Drawing Sheets

(56) References Cited

U.S. PATENT DOCUMENTS

2014/0256180 A1* 9/2014 Xiao .................... H01R 13/512
439/607.22

* cited by examiner

ELECTRONIC DEVICE

BACKGROUND OF THE INVENTION

1. Field of the Invention

The invention relates to an electronic device and, more particularly, to an electronic device capable of grounding an electronic component effectively.

2. Description of the Prior Art

At present, a power socket is disposed on a circuit board in lots of electronic devices and used to connect a power cable. In general, the power socket has a ground wire and the ground wire is fixed to a ground screw hole of an iron member to form a ground loop. To prevent the ground wire from contacting the circuit board, two fixing holes have to be formed on the circuit board, wherein one fixing hole is used to ensure safety ground for the power socket and the other fixing hole is used to fix the circuit board. Accordingly, the grounding manner of the prior art is inefficient and the manufacture cost will increase.

SUMMARY OF THE INVENTION

An objective of the invention is to provide an electronic device capable of grounding an electronic component effectively, so as to solve the aforesaid problems.

According to an embodiment of the invention, an electronic device comprises a casing, a circuit board, an electronic component and a fixing member. The casing comprises a fixing pillar and at least one rib. The at least one rib is connected to a periphery of the fixing pillar. A first top surface of the fixing pillar protrudes from a second top surface of the at least one rib with a height. The circuit board comprises a through hole. The fixing pillar is disposed in the through hole. The circuit board abuts against the second top surface of the at least one rib. A thickness of the circuit board is smaller than the height between the first top surface of the fixing pillar and the second top surface of the at least one rib. The electronic component is disposed on the casing. The electronic component comprises a first metal member. A first ground end of the first metal member is disposed on the first top surface of the fixing pillar. A gap exists between the first ground end and the circuit board. The fixing member fixes the first ground end to the fixing pillar.

As mentioned in the above, the invention uses the fixing member to fix the first ground end of the first metal member of the electronic component to the fixing pillar of the casing, so as to form a ground loop. Since the first top surface of the fixing pillar protrudes from the second top surface of the rib with a height and the thickness of the circuit board is smaller than the height, a gap exists between the first ground end of the first metal member and the circuit board (i.e. the first ground end of the first metal member does not contact the circuit board) when the circuit board abuts against the second top surface of the rib. Accordingly, the invention can ensure safety ground for the electronic component, so as to conform to the requirement of safety test. Furthermore, the invention does not need additional ground wire, so the assembly process is efficient and the manufacture cost can decrease.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
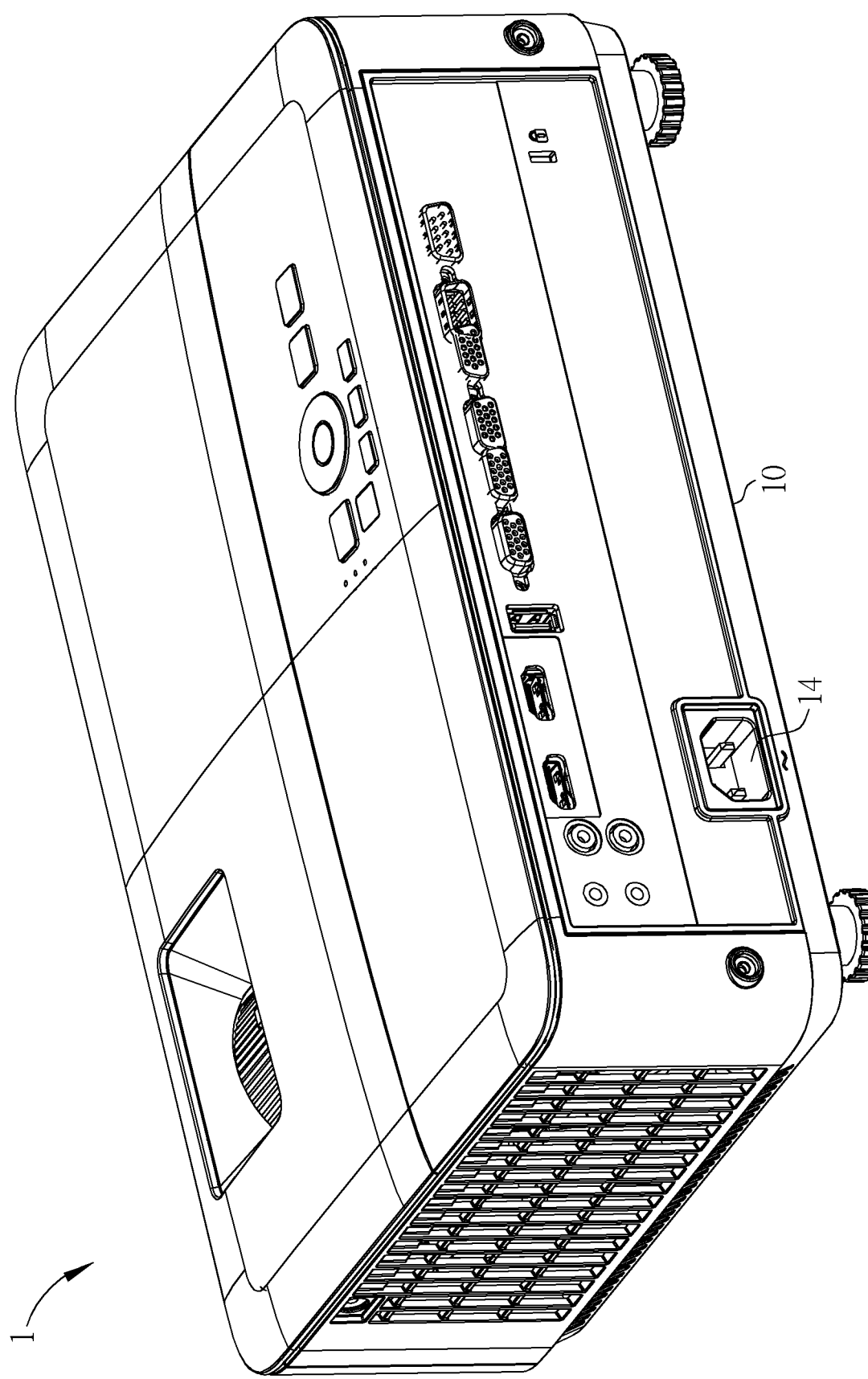
FIG. 1 is a perspective view illustrating an electronic device according to an embodiment of the invention.
Figure 2:
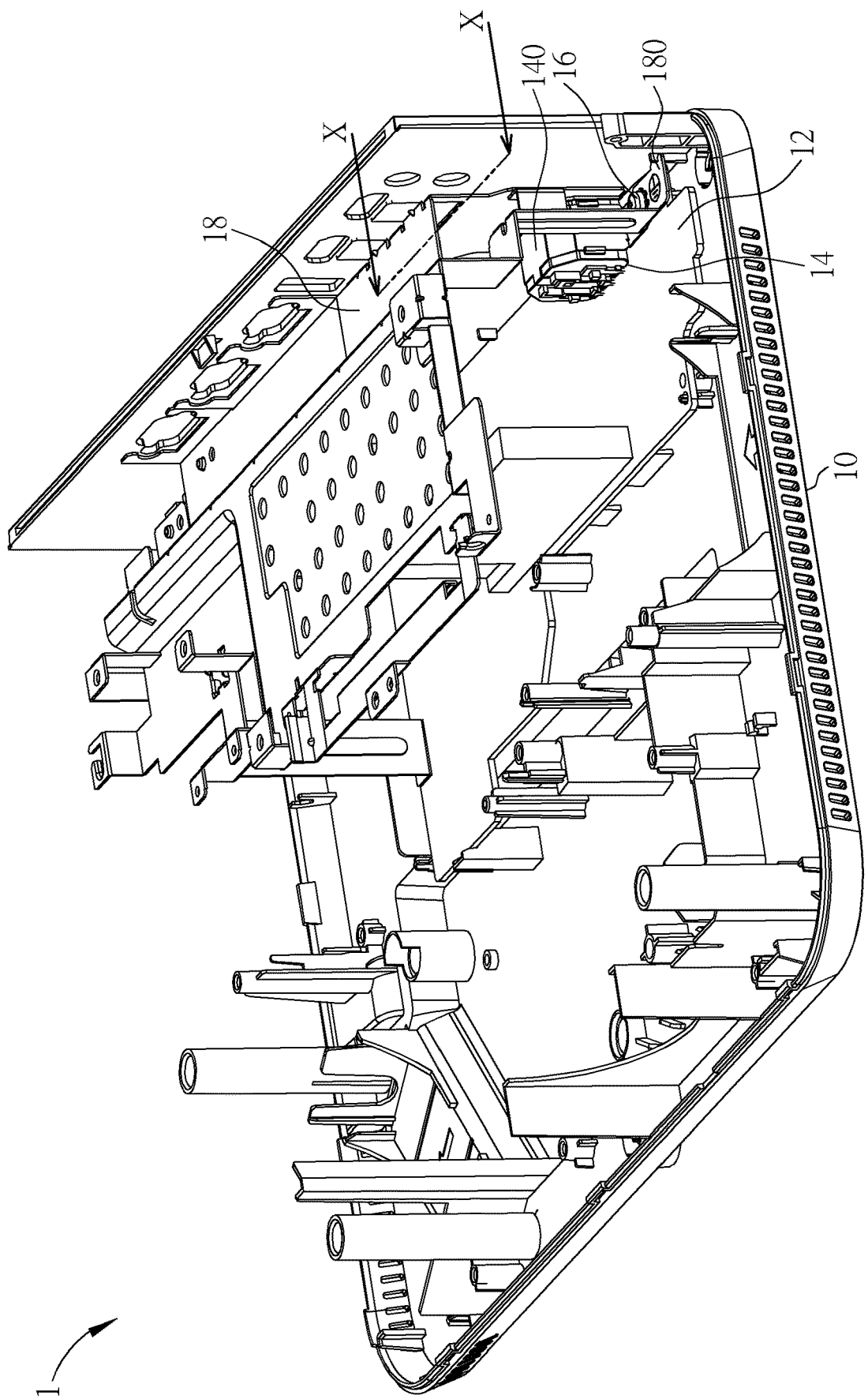
FIG. 2 is a partial inner view illustrating the electronic device shown in FIG. 1.
Figure 3:
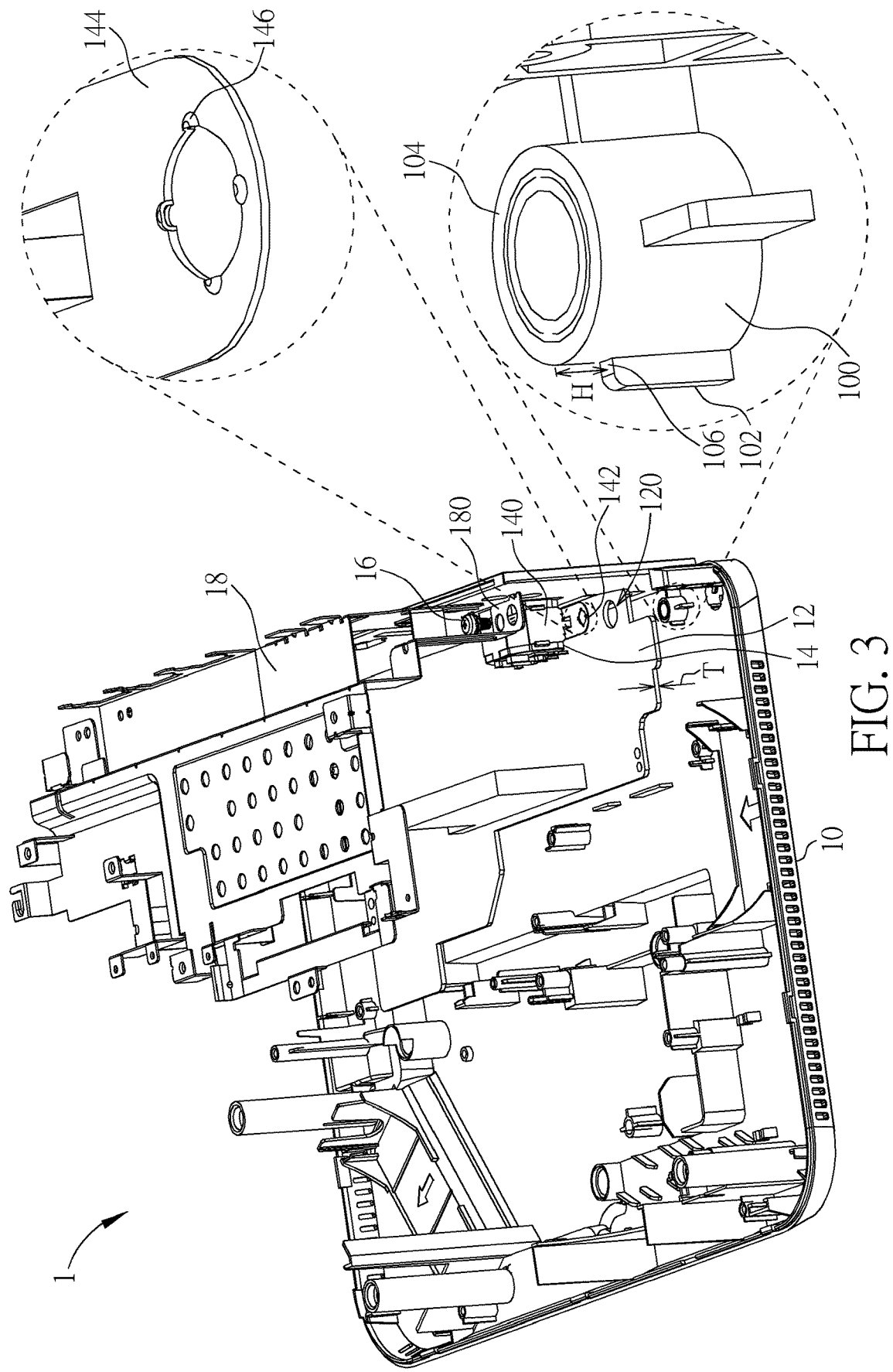
FIG. 3 is an exploded view illustrating the electronic device shown in FIG. 2.
Figure 4:
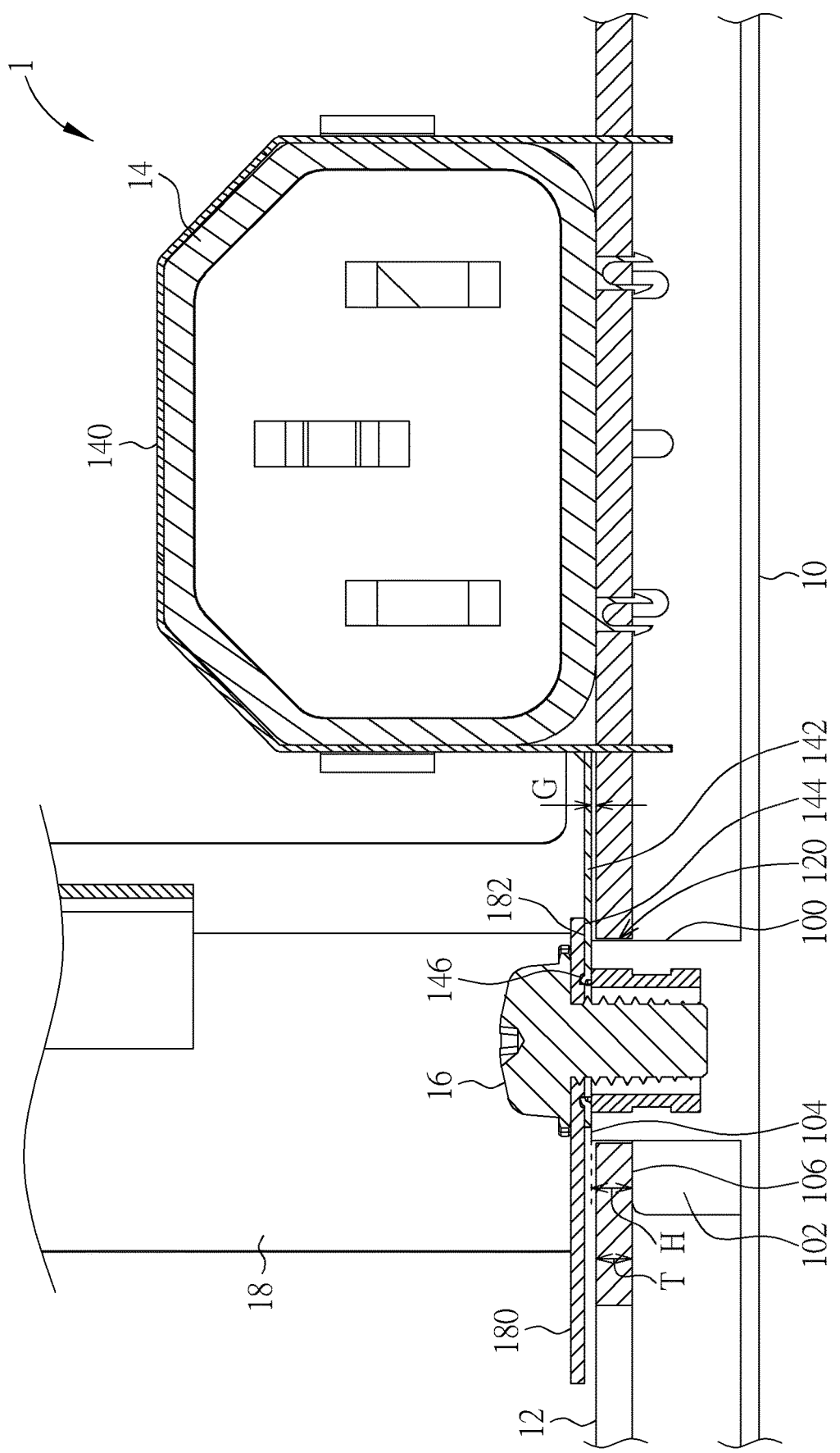
FIG. 4 is a partial sectional view illustrating the electronic device shown in FIG. 2 along line X-X.

Referring to FIGS. 1 to 4, FIG. 1 is a perspective view illustrating an electronic device 1 according to an embodiment of the invention, FIG. 2 is a partial inner view illustrating the electronic device 1 shown in FIG. 1, FIG. 3 is an exploded view illustrating the electronic device 1 shown in FIG. 2, and FIG. 4 is a partial sectional view illustrating the electronic device 1 shown in FIG. 2 along line X-X.

As shown in FIGS. 1 to 4, the electronic device 1 comprises a casing 10, a circuit board 12, an electronic component 14, a fixing member 16 and a second metal member 18. In this embodiment, the electronic device 1 may be, but not limited to, a projector and the electronic component 14 may be, but not limited to, a socket. In general, the electronic device 1 may be further equipped with some necessary hardware or software components for specific purposes, such as a memory, an input/output port, applications, a power supply, a communication module, etc., and it depends on practical applications.

As shown in FIG. 3, the casing 10 comprises a fixing pillar 100 and at least one rib 102, wherein the at least one rib 102 is connected to a periphery of the fixing pillar 100. In this embodiment, three ribs 102 are connected to the periphery of the fixing pillar 100 to reinforce structural strength of the fixing pillar 100. It should be noted that the number of the ribs 102 may be determined according to practical applications, so the invention is not limited to the embodiment shown in the figures. A first top surface 104 of the fixing pillar 100 protrudes from a second top surface 106 of the rib 102 with a height H. The circuit board 12 comprises a through hole 120 and a thickness T of the circuit board 12 is smaller than the height H between the first top surface 104 of the fixing pillar 100 and the second top surface 106 of the rib 102. The electronic component 14 comprises a first metal member 140.

To assemble the circuit board 12, the electronic component 14 and the second metal member 18 to the casing 10, an operator may dispose the fixing pillar 100 of the casing 10 in the through hole 120 of the circuit board 12 first, such that the circuit board 12 abuts against the second top surface 106 of the rib 102. Then, the operator may dispose the electronic component 14 on the casing 10 and dispose a first ground end 142 of the first metal member 140 on the first top surface 104 of the fixing pillar 100. Then, the operator may dispose the second metal member 18 in the casing 10 and dispose a second ground end 180 of the second metal member 18 on the first ground end 142 of the first metal member 140. Then, the operator may use the fixing member 16 to fix the second ground end 180 of the second metal member 18 and the first ground end 142 of the first metal member 140 to the fixing pillar 100. In this embodiment, the fixing member 16 may be a screw and the fixing pillar 100 may has a screw hole for fixing the screw.

Since the thickness T of the circuit board 12 is smaller than the height H between the first top surface 104 of the fixing pillar 100 and the second top surface 106 of the rib 102, a gap G (as shown in FIG. 4) exists between the first ground end 142 of the first metal member 140 and the circuit board 12 (i.e. the first ground end 142 of the first metal member 140 does not contact the circuit board 12) when the circuit board 12 abuts against the second top surface 106 of the rib 102. Accordingly, the invention can ensure safety ground for the electronic component 14, so as to conform to the requirement of safety test.

In this embodiment, the invention may adjust the dimension of the gap G by adjusting the height H between the first top surface 104 of the fixing pillar 100 and the second top surface 106 of the rib 102. Furthermore, the dimension of the gap G may be determined according to practical safety regulation. For example, the gap G must be larger than 0.1 mm for safety regulation IEC 62368.

As shown in FIG. 4, after the assembly process, a first contact surface 144 of the first ground end 142 of the first metal member 140 contacts a second contact surface 182 of the second ground end 180 of the second metal member 18. In this embodiment, the first contact surface 144 may have a plurality of protrusions 146, such that the first contact surface 144 is uneven. Accordingly, after the fixing member 16 fixes the second ground end 180 of the second metal member 18 and the first ground end 142 of the first metal member 140 to the fixing pillar 100, the invention can ensure that the first contact surface 144 and the second contact surface 182 contact with each other tightly. It should be noted that in addition to the aforesaid protrusion 146, the first contact surface 144 may also be formed as a wavy structure, a saw-toothed structure or other uneven structures according to practical applications. In another embodiment, the second contact surface 182 may also be uneven. That is to say, at least one of the first contact surface 144 and the second contact surface 182 may be uneven, so as to ensure that the first contact surface 144 and the second contact surface 182 contact with each other tightly.

As mentioned in the above, the invention uses the fixing member to fix the first ground end of the first metal member of the electronic component to the fixing pillar of the casing, so as to form a ground loop. Since the first top surface of the fixing pillar protrudes from the second top surface of the rib with a height and the thickness of the circuit board is smaller than the height, a gap exists between the first ground end of the first metal member and the circuit board (i.e. the first ground end of the first metal member does not contact the circuit board) when the circuit board abuts against the second top surface of the rib. Accordingly, the invention can ensure safety ground for the electronic component, so as to conform to the requirement of safety test. Furthermore, the invention does not need additional ground wire, so the assembly process is efficient and the manufacture cost can decrease.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device comprising:
    a casing comprising a fixing pillar and at least one rib, the at least one rib being connected to a periphery of the fixing pillar, a first top surface of the fixing pillar protruding from a second top surface of the at least one rib with a height;
    a circuit board comprising a through hole, the fixing pillar being disposed in the through hole, the circuit board abutting against the second top surface of the at least one rib, a thickness of the circuit board being smaller than the height;
    an electronic component disposed on the casing, the electronic component comprising a first metal member, a first ground end of the first metal member being disposed on the first top surface of the fixing pillar, a gap existing between the first ground end and the circuit board; and
    a fixing member fixing the first ground end to the fixing pillar.

2. The electronic device of claim 1, further comprising a second metal member disposed in the casing, a second ground end of the second metal member being disposed on the first ground end, the fixing member fixing the second ground end and the first ground end to the fixing pillar.

3. The electronic device of claim 2, wherein a first contact surface of the first ground end contacts a second contact surface of the second ground end, and at least one of the first contact surface and the second contact surface is uneven.

4. The electronic device of claim 1, wherein the electronic component is a socket.

* * * * *